United States Patent
Chen et al.

(10) Patent No.: US 8,410,405 B2
(45) Date of Patent: Apr. 2, 2013

(54) TEMPERATURE CONTROL SYSTEM

(75) Inventors: Xiang-Biao Chen, Shenzhen (CN);
Yu-Lin Liu, Shenzhen (CN); Qiang Zhang, Shenzhen (CN)

(73) Assignees: Hong Fu Jin Precision Industry (ShenZhen) Co., Ltd., Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 426 days.

(21) Appl. No.: 12/783,624

(22) Filed: May 20, 2010

(65) Prior Publication Data

US 2011/0174795 A1     Jul. 21, 2011

(30) Foreign Application Priority Data

Jan. 20, 2010  (CN) .......................... 2010 1 0300479

(51) Int. Cl.
*H05B 1/00*     (2006.01)
(52) U.S. Cl. ........................................... 219/482
(58) Field of Classification Search ............ 219/482
See application file for complete search history.

(56) References Cited

U.S. PATENT DOCUMENTS

| | | | | |
|---|---|---|---|---|
| 5,744,927 A * | 4/1998 | Hayashida | ..................... | 318/599 |
| 6,803,672 B2 * | 10/2004 | Gunasekera | ................... | 307/9.1 |
| 7,219,027 B1 * | 5/2007 | Lee et al. | ......................... | 702/79 |
| 7,463,040 B2 * | 12/2008 | Qi et al. | ......................... | 324/693 |
| 2006/0091837 A1 * | 5/2006 | Xiong et al. | ................... | 318/254 |
| 2007/0182608 A1 * | 8/2007 | Testin | .......................... | 341/139 |
| 2009/0104016 A1 * | 4/2009 | Zhou | ............................... | 415/47 |

* cited by examiner

*Primary Examiner* — Eugene Lee
(74) *Attorney, Agent, or Firm* — Altis Law Group, Inc.

(57) ABSTRACT

A temperature control system includes a temperature sensing module, a temperature control module, a pulse width modulation control module, a heating module, a heat dissipating module, and a switch module. The temperature sensing module is configured to obtain a current ambient temperature in a test box. The temperature control module is configured to output a control signal according to a difference between the current ambient temperature and a reference temperature. The pulse width modulation control module is configured to output a pulse width modulation signal according to the control signal. The switch module is configured to instruct the heating module or the heat dissipating module according to the pulse width modulation signal to keep the current ambient temperature generally equal to the reference temperature in the test box.

16 Claims, 6 Drawing Sheets

TEMPERATURE CONTROL SYSTEM

BACKGROUND

1. Technical Field

The present disclosure relates to temperature control systems, especially to a temperature control system for controlling ambient temperature in a container.

2. Description of Related Art

There are times when it is desirable to maintain temperature in an enclosed ambient, such as a container. One such container is, referring to FIG. 1, a temperature control box 1a used for testing computer components according to the prior art. The temperature control box 1a includes a power source 10a, a temperature sensing module 50a, a temperature control module 30a connected to the temperature sensing module 50a, a switch module 70a connected to the temperature control module 30a, a heating module 20a, and a heat dissipating module 40a. Operation of the temperature control box 1a is simple. Temperature inside the box 1a is constantly taken by the sensing module 50a. The result is monitored by the control module 30a. When the temperature is higher than a desired temperature or range, the control module 30 controls the switch module 70a to turn on the heat dissipating module 40a, and when the temperature is too low the heating module 20a is turned on. The problem with this system is that a steady voltage is supplied when the heating module 20a or the heat dissipating module 40a is on, which is unnecessary and wastes energy.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
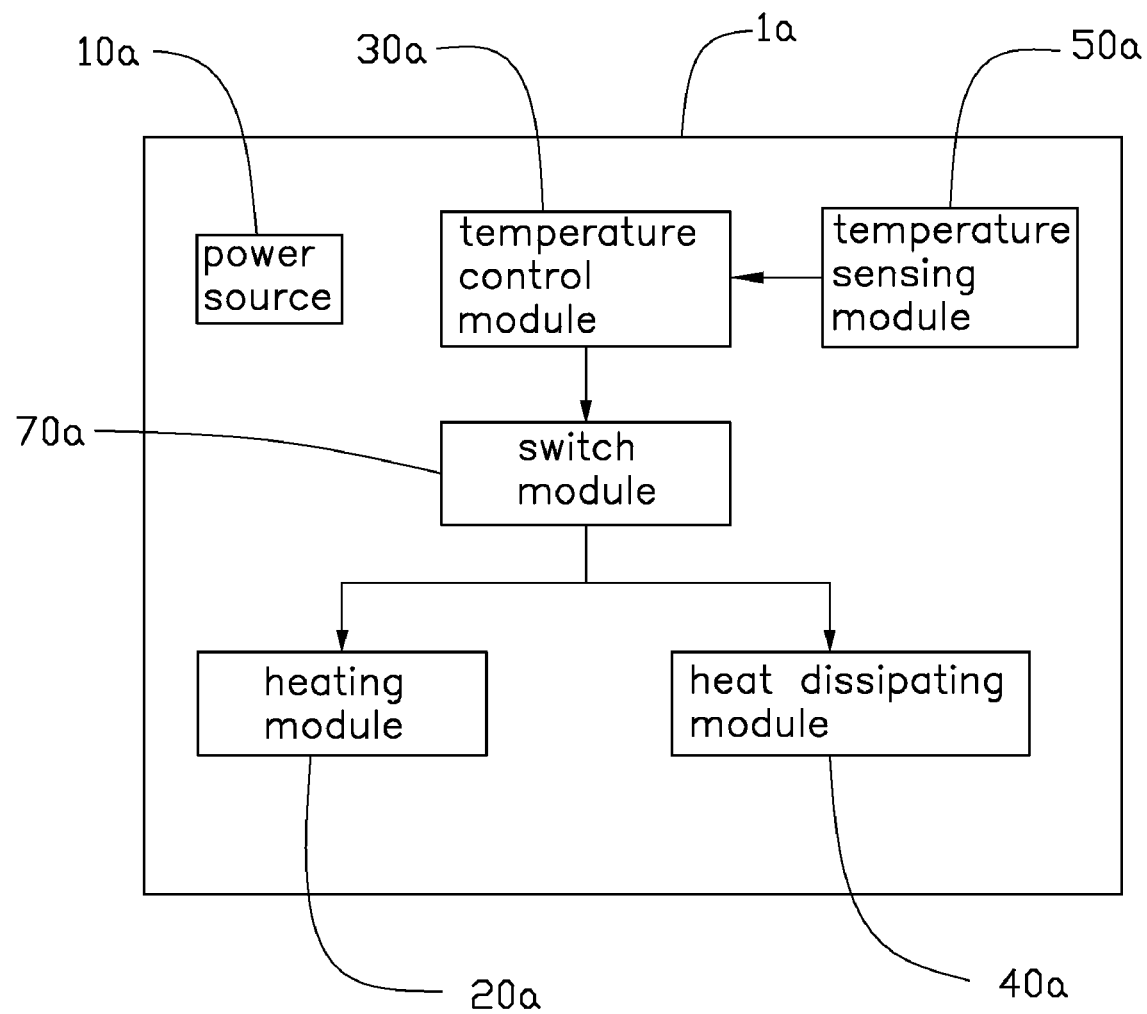
FIG. 1 is a sketch view of a temperature control system according to the prior art.
Figure 2:
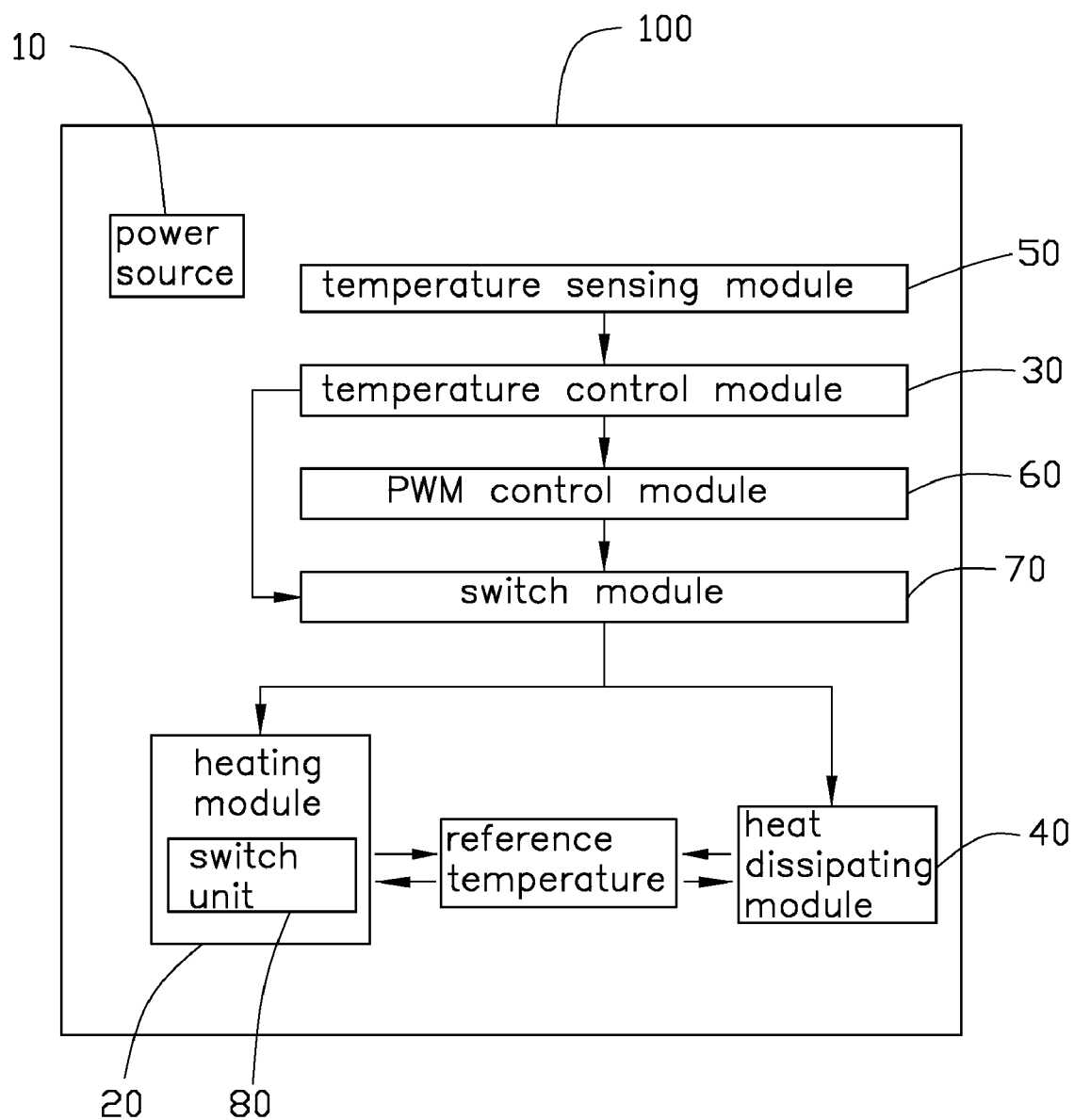
FIG. 2 is a sketch view of a temperature control system in accordance with an embodiment.

Referring to FIG. 2, a temperature control system 100, used in a test box, includes a power supply 10, a temperature sensing module 50, a temperature control module 30 connected to the temperature sensing module 50, a pulse width modulation (PWM) control module 60 connected to the temperature control module 30, a switch module 70 connected to the temperature sensing module 50 and the PWM control module 60, and a temperature modulating module connected to the switch module 70. In one embodiment, the temperature modulating module includes at least one of a heating module 20 and a heat dissipating module 40, and the temperature control module 30 includes a micro control unit (MCU). The heating module 20 includes a switch unit 80.

A reference temperature T0 and an offset value are predetermined in the temperature control module 30. The offset value may be, for example, 0.3 or 0.5 degree centigrade. When the temperature control system 100 is in use, the temperature sensing module 50 obtains a current ambient temperature T1 and transmits it to the temperature control module 30. The temperature control module 30 compares the ambient temperature T1 with the reference temperature T0. If ambient T1 is less than T0, the temperature control module 30 sends a first voltage signal to the switch module 70, to switch on the heating module 20, and sends a first control signal to the PWM control module 60. Then the PWM control module 60 sends a first PWM signal to control the switch unit 80 and further control the heating module 20. If the difference between the current ambient temperature T1 and the reference temperature T0 is less than the offset value, duty cycle of the first PWM signal decreases. If ambient T1 is equal to T0, the switch unit 80 is switched off to prevent the heating module 20 heating continually.

If the difference between the current ambient temperature T1 and the reference temperature T0 is greater than the offset value, the temperature control module 30 sends a second voltage signal to the switch module 70, to switch on the heat dissipating module 40, and sends a second control signal to the PWM control module 60. The PWM control module 60 sends a second PWM signal to control the heat dissipating module 40. If the current ambient temperature T1 is equal to the reference temperature T0, the switch module 70 switches off the heat dissipating module 40. The PWM signal controls the heating module 20 or the heat dissipating module 40 to work spasmodically, which saves energy.

Figure 3:
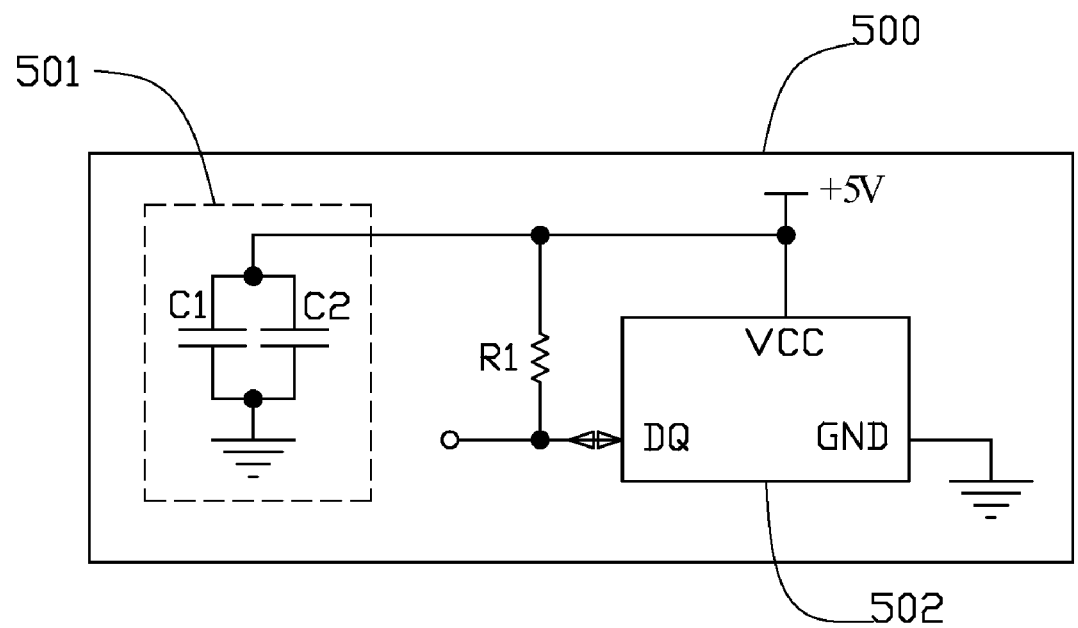
FIG. 3 is a circuit diagram of a temperature sensing circuit of a temperature control system in accordance with an embodiment.

Referring to FIG. 3, a temperature sensing circuit 500, applied in the temperature sensing module 50, includes a filter circuit 501 and a temperature sensing chip 502. In one embodiment, the temperature sensing chip 502 is a DS18B20 chip. The filter circuit 501 includes two capacitors C1, C2 connected in parallel. The filter circuit 501 has one terminal connected to a 5V power source and another terminal connected to ground. The temperature sensing chip 502 includes a power source pin VCC connected to the 5V power source, a ground pin GND connected to ground, and an output pin DQ connected to the 5V power source via a resistor R1. The temperature sensing chip 502 is used for converting the current ambient temperature T1 to a digital signal and outputting the digital signal via the output pin DQ.

Figure 4:
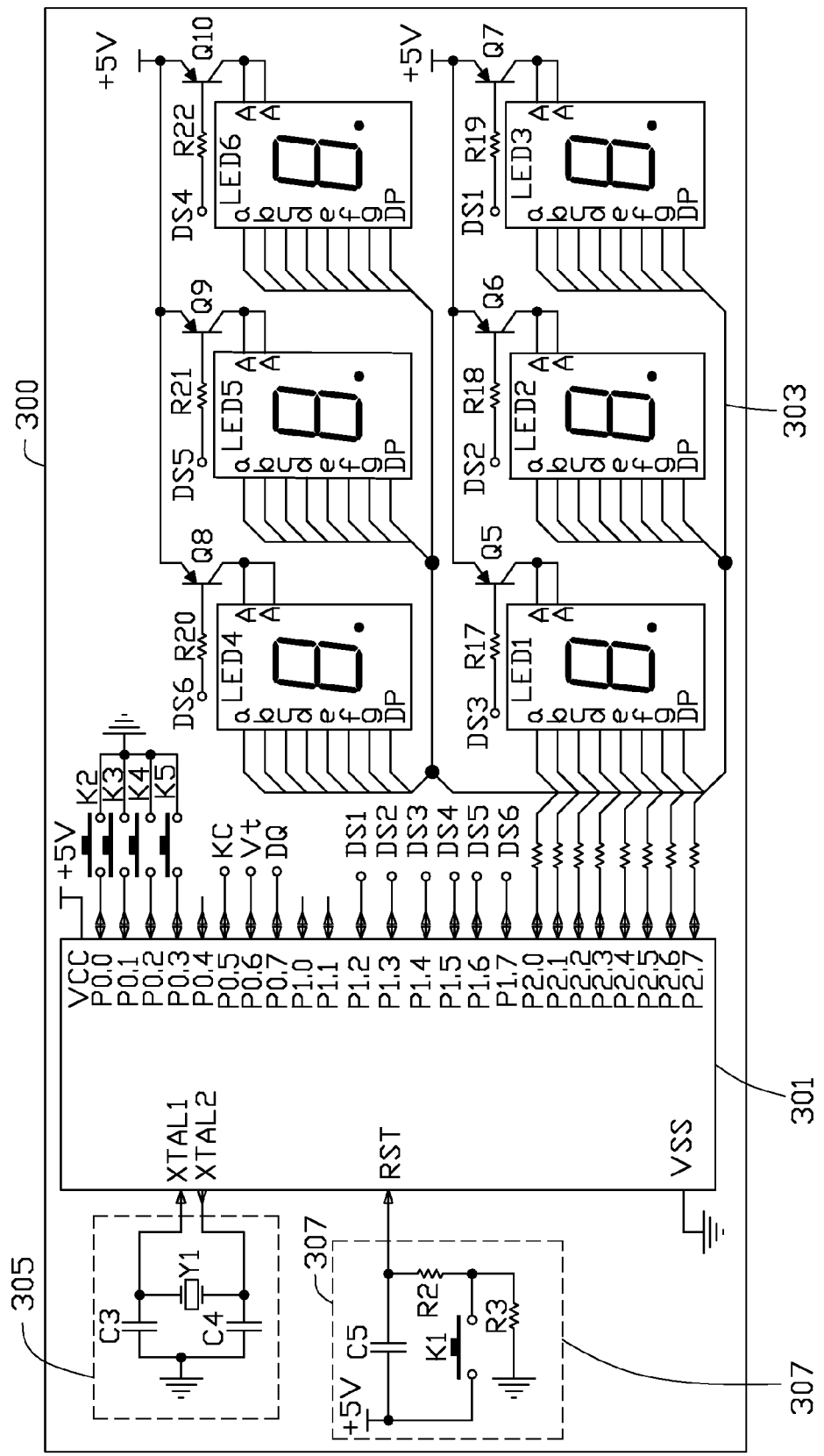
FIG. 4 is a circuit diagram of a data processing and displaying circuit of a temperature control system in accordance with an embodiment.

Referring to FIG. 4, a data processing and displaying circuit 300 is applied in the temperature control module 30. The data processing and displaying circuit 300 is capable of displaying the reference temperature T0 and the current ambient temperature T1. The data processing and displaying circuit 300 is capable of outputting a voltage signal to control the switch module 70 after comparing the reference temperature T0 and the current ambient temperature T1. The data processing and displaying circuit 300 is further capable of outputting a control signal to control the PWM control module 60 to output a PWM signal. The data processing and displaying circuit 300 includes a control chip 301 and displaying circuit 303. In one embodiment, the control chip 301 is AT89S52 chip. A power pin VCC of the control chip 301 is connected to a +5V power source, and a ground pin VSS of the control chip 301 is connected to ground. Two clock pins XTAL1, XTAL2 of the control chip 301 are connected to a clock circuit 305. The clock circuit 305 includes a crystal oscillator Y1 and two capacitors C3, C4. The clock pin XTAL1 is connected to ground via the capacitor C3, and the clock pin XTAL2 is connected to ground via the capacitor C4. The crystal oscillator Y1 is connected between the clock pins XTAL1, XTAL2. A reset pin RST of the control chip 301 is connected to a reset control circuit 307. The reset control circuit 307 includes a switch K1. The reset pin RST is connected to a +5V power source via a capacitor C5. The reset pin RST is connected to ground via a resistor R2 and a resistor R3. A terminal of the resistor R2 connected to the resistor R3 is connected to the +5V power source via the switch K1. Pins P0.0 to P0.3 of the control chip 301 are connected to ground via four switches K2 to K5 respectively. The switch K2 is used for increasing the reference temperature T0. The switch K3 is used for decreasing the reference temperature T0. The switch K4 is used for setting the offset value, and the switch K5 is used for confirming the set value. Pin P0.7 is connected to an output pin DQ of the temperature sensing chip 502. The pin P0.7 is used for receiving a digital signal output by the temperature sensing chip 502 corresponding to the current ambient temperature T1. Pin P0.5 is a voltage signal output pin KC. The pin P0.5 is used for outputting a voltage signal to control the switch module 70. Pin P0.6 is a control signal output pin Vt. The pin P0.6 is used for outputting a control signal to control the PWM control module 60 to output a PWM signal. Pins P2.0 to P7.0 are connected to the displaying circuit 303. The displaying circuit 303 includes six light-emitting diodes (LEDs), LED1 to LED6. Each LED includes eight pins a, b, c, d, e, f, g, and DP connected to the pins P2.0 to P2.7 respectively. Power pins A of the six LEDs, LED1 to LED 6 are connected to the +5V power source via transistors Q5, Q6, Q7, Q8, Q9, Q10. The bases of the transistors Q5 to Q10 are connected to nodes DS3, DS2, DS1, DS6, DS5, DS4 via resistors R17 to R22 respectively. The nodes DS1 to DS6 are connected to pins P1.2 to P1.7 of the control chip 301 respectively. The LEDs LED1, LED2, and LED3 are used for displaying the reference temperature T0. The LEDs LED4, LED5, and LED6 are used for displaying the current ambient temperature T1.

Figure 5:
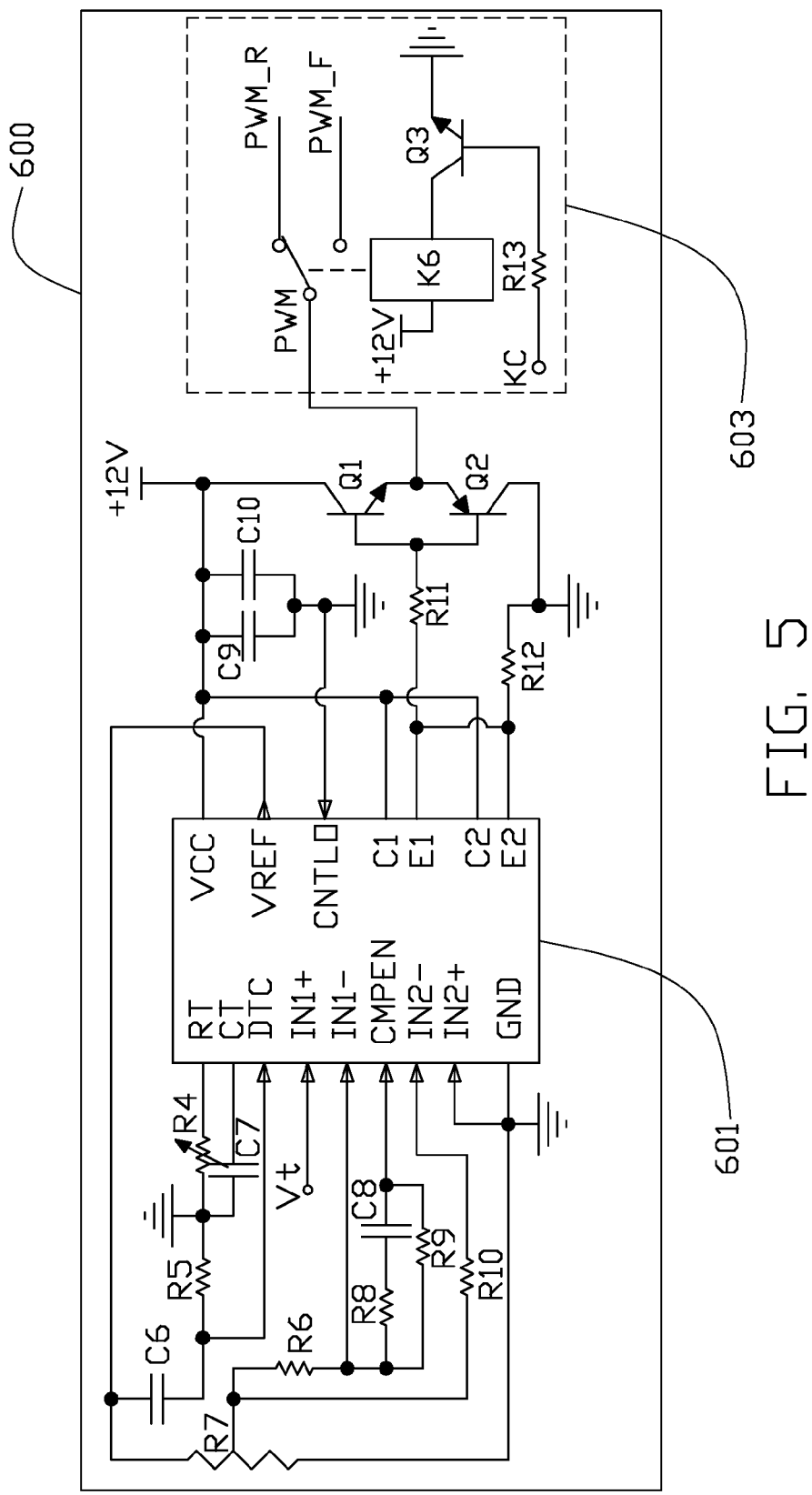
FIG. 5 is a circuit diagram of a PWM control and switch circuit of a temperature control system in accordance with an embodiment.

Referring to FIG. 5, a PWM control and switch circuit 600 includes a PWM chip 601 applied in the PWM control module 60 and a switch circuit 603 applied in the switch module 70. In one embodiment, the PWM chip 601 is TL494 chip. A pin RT of the PWM chip 601 is connected to ground via a rheostat R4. A pin VREF of the PWM chip 601 is connected to a first node via a capacitor C6. The first node is connected to a pin DTC of the PWM chip 601, and connected to ground via a resistor R5. A pin CT of the PWM chip 601 is connected to ground via a capacitor C7. A pin IN1+ is connected to the control signal output pin Vt of the control chip 301. The pin IN1+ is used for receiving the control signal sent by the control chip 301. A pin Ni− is connected to a second node. The second node is connected to a wiper of a potentiometer R7 via a resistor R6. The second node is connected to a pin CMPEN via a resistor R8 and a capacitor C8. The second node is also connected to the pin CMPEN via a resistor R9. The wiper of the potentiometer R7 is connected to a pin IN2− via a resistor R10. A terminal of the potentiometer R7, a pin IN2+, and a pin GND are connected to ground. Another terminal of the potentiometer R7 is connected to the pin VREF. A pin VCC is connected to a +12 V power source. The +12 V power source is connected to ground via the capacitors C9 and C10. A pin C1 and a pin C2 are connected to the pin VCC. A pin CNTL0 is connected to ground. A pin E1 is connected to a base of an npn transistor Q1 and a base of a pnp transistor Q2. A pin E2 is connected to the pin E2, and connected to ground via a resistor R12. A collector of the npn transistor Q1 is connected to the +12 V power source. A collector of the pnp transistor Q2 is connected to ground. An emitter of the npn transistor Q1 and an emitter of the pnp transistor Q2 are connected to the switch circuit 603. The switch circuit 603 includes a relay K6. The relay K6 includes a terminal PWM R, a terminal PWM F, a first terminal, and a second terminal The first terminal of the relay K6 is connected to the +12 V power source. The second terminal of the relay K6 is connected to a collector of an npn transistor Q3. A base of the npn transistor Q3 is connected to the voltage signal output pin KC via a resistor R13. An emitter of the npn transistor Q3 is connected to ground.

Figure 6:
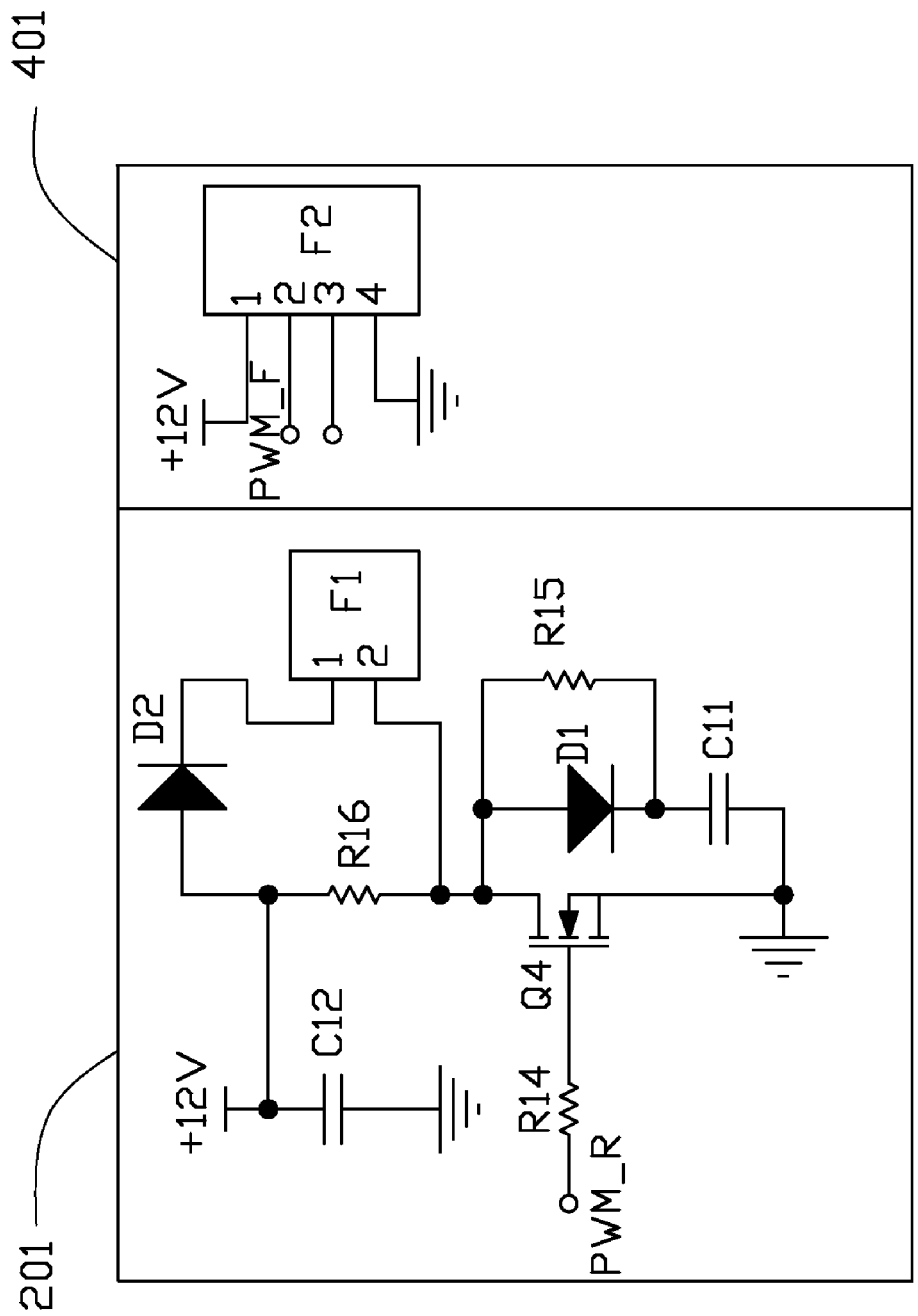
FIG. 6 is a circuit diagram of a heating and heat dissipating circuit of a temperature control system in accordance with an embodiment.

Referring to FIGS. 5 and 6, a heating and heat dissipating circuit is applied in the heating module 20 and the heat dissipating module 40. The heating and heat dissipating circuit includes a heating circuit 201 and a heat dissipating circuit 401. The heating circuit 201 includes an N-channel metal-oxide-semiconductor (nMOS) transistor Q4 and a fan F1. A gate of the nMOS Q4 is connected to the terminal PWM_R of the relay K6. A drain of the nMOS Q4 is connected to a positive pole of a diode D1. A negative pole of the diode D1 is connected to ground via a capacitor C11. The diode D1 is in parallel with a resistor R15. A source of the nMOS Q4 is connected to ground. The drain of the nMOS Q4 is connected to the +12 V power source via a resistor R16. The +12 V power source is connected to ground via a capacitor C12. The +12 V power source is connected to a pin 1 of the fan F1 via a diode D2. A positive pole of the diode D2 is connected to the +12 V power source and a negative pole of the diode D2 is connected to the pin 1 of the fan F1. A pin 2 of the fan F1 is connected to the drain of the nMOS Q4. The heat dissipating module 401 includes a fan F2 configured to receive the second PWM signal. The fan F2 includes four terminals 1, 2, 3, 4. The terminal 1 of the fan F2 is connected to the +12 V power source. The terminal 2 of the fan F2 is connected to the terminal PWM_F of the relay K6. The terminal 4 of the fan F2 is connected to ground.

Referring to FIGS. 2 through 6, the working principle of the temperature control system 100 is described below.

The reference temperature T0 and the offset value is predetermined by pressing the switches K2, K3, K4, K5 of the control chip 301. The reference temperature T0 is indicated by the LEDs LED1, LED2, and LED3. The temperature sensing chip 502 senses the current ambient temperature T1 and converts it to a digital signal, and then outputs the digital signal to the pin P0.7 of the control chip 301 via the output pin DQ of the temperature sensing chip 502. The control chip 301 displays the current ambient temperature T1 via the LEDs LED4, LED5, and LED6, and compares the digital signal with the reference temperature T0. If the current ambient temperature T1 is less than the reference temperature T0, the pin P0.5 of the control chip 301 outputs the first voltage signal to the switch circuit 603, and the pin P0.6 outputs the first control signal to the pin IN1+ of the PWM chip 601. The PWM chip 601 outputs the first PWM signal via the transistors Q1, Q2 to enable the relay K6 to turn on the terminal PWM_R. The first PWM signal is transferred to the heating circuit 201 via the terminal PWM_R. The first PWM signal controls the heating circuit 201 by controlling the nMOS Q4. If the difference between the current ambient temperature T1 and the reference temperature T0 is less than the offset value, the first PWM signal controls the heating circuit 201 to reduce the heating time. If the current ambient temperature T1 is equal to the reference temperature T0, the terminal PWM_R of the relay K6 is turned off.

If the current ambient temperature T1 is greater than the reference temperature T0 and the difference between the current ambient temperature T1 and the reference temperature T0 is greater than the offset value; the pin P0.5 outputs the second voltage signal to the switch circuit 603; the pin P0.6 outputs the second control signal to the pin IN1+ of the PWM chip 601. The PWM chip 601 outputs the second PWM signal via the transistor Q1, Q2, to enable the relay K6 to turn on the terminal PWM_F. The second PWM signal is transferred to the heat dissipating circuit 401 via the terminal PWM_F. The second PWM signal controls speed of heat dissipation by controlling the rotating speed of the fan F2. If the current ambient temperature T1 is equal to the reference temperature T0, the terminal PWM_F of the relay K6 is turned off.

It is to be understood, however, that even though numerous characteristics and advantages of the present disclosure have been set forth in the foregoing description, together with details of the structure and function of the disclosure, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A temperature control system, comprising:
a temperature sensing module configured to obtain a current ambient temperature in a test box;
a heating module;
a heat dissipating module;
a switch module configured to instruct the heating module or the heat dissipating module to keep the current ambient temperature generally equal to a reference temperature in the test box;
a pulse width modulation control module configured to output a pulse width modulation signal to switch module to instruct the heating module or the heat dissipating module; and
a temperature control module configured to output a control signal to the pulse width modulation control module to output pulse width modulation signal according to a difference between the current ambient temperature and the reference temperature.

2. The temperature control system of claim 1, wherein the control module controls a duty cycle of the pulse width modulation signal to decrease if the difference between the current ambient temperature and the reference temperature is less than a predetermined offset.

3. The temperature control system of claim 1, wherein the heating module comprises a switch unit, and the pulse width modulation signal is capable of controlling heating speed via the switch unit.

4. The temperature control system of claim 3, wherein the switch unit comprises a metal oxide semiconductor transistor, a gate of the metal oxide semiconductor transistor capable of receiving the pulse width modulation signal, a drain of the metal oxide semiconductor transistor connected to a fan, and a source of the metal oxide semiconductor transistor connected to ground.

5. The temperature control system of claim 1, wherein the heat dissipating module comprises a fan, and the pulse width modulation signal is capable of controlling the heat dissipating speed via the fan.

6. The temperature control system of claim 1, wherein the temperature control module comprises a micro control unit, the micro control unit is capable of receiving the current ambient temperature sent by the temperature sensing module and outputting the control signal according to the difference between the current ambient temperature and the reference temperature.

7. The temperature control system of claim 6, wherein the switch module is turned off if the current ambient temperature is equal to the reference temperature.

8. The temperature control system of claim 1, wherein the switch module comprises a relay, the pulse width modulation signal is capable of being sent to the heating module or the heat dissipating module via the relay.

9. A temperature control system, comprising:
a temperature sensing module configured to obtain a current ambient temperature in a test box;
a temperature control module configured to output a control signal according to a difference between the current ambient temperature and a reference temperature;
a pulse width modulation control module configured to output a pulse width modulation signal according to the control signal;
a temperature modulating module configured to heat or dissipate heat; and
a switch module configured to instruct the temperature modulating module to heat or dissipate heat according to the pulse width modulation signal in order to keep the current ambient temperature generally equal to the reference temperature in the test box;
wherein the switch module is capable of instructing the temperature modulating module to heat if the current ambient temperature is less than the reference temperature, and instructing the temperature modulating module to dissipate heat if the current ambient temperature is greater than the reference temperature.

10. The temperature control system of claim 9, wherein the control module controls a duty cycle of the pulse width modulation signal to decrease if the difference between the current ambient temperature and the reference temperature is less than a predetermined offset.

11. The temperature control system of claim 9, wherein the temperature modulating module comprises a switch unit, the pulse width modulation signal is capable of instructing the heating speed via the switch unit.

12. The temperature control system of claim 11, wherein the switch unit comprises a metal oxide semiconductor transistor, a gate of the metal oxide semiconductor transistor capable of receiving the pulse width modulation signal, a drain of the metal oxide semiconductor transistor connected to a fan, and a source of the metal oxide semiconductor transistor connected to ground.

13. The temperature control system of claim 9, wherein the temperature modulating module comprises a fan, and the pulse width modulation signal controls the heat dissipating speed via the fan.

14. The temperature control system of claim 9, wherein the temperature control module comprises a micro control unit, the micro control unit is capable of receiving the current ambient temperature sent by the temperature sensing module and outputting the control signal according to the difference between the current ambient temperature and the reference temperature.

15. The temperature control system of claim 9, wherein the switch module is turned off if the current ambient temperature is equal to the reference temperature.

16. The temperature control system of claim 9, wherein the switch module comprises a relay, and the pulse width modulation signal is capable of being sent to the heating module or the heat dissipating module via the relay.

* * * * *